United States Patent [19]
Banh et al.

[11] Patent Number: 5,721,757
[45] Date of Patent: Feb. 24, 1998

[54] AUTOMATIC GAIN CONTROL LOOP

[75] Inventors: An Tuyen Banh, Forest, Va.; Rulon G. VanDyke, Parsippany, N.J.

[73] Assignee: Lucent Technologies Inc., Murray Hill, N.J.

[21] Appl. No.: 619,044

[22] Filed: Mar. 20, 1996

[51] Int. Cl.$^6$ .................................................. H04L 27/08
[52] U.S. Cl. ........................................ 375/345; 375/316
[58] Field of Search ....................................... 375/345, 316, 375/329, 332; 455/67.1

[56] References Cited

U.S. PATENT DOCUMENTS

| | | | |
|---|---|---|---|
| 4,186,348 | 1/1980 | Lautier et al. | 325/320 |
| 4,313,215 | 1/1982 | Jansen | 455/212 |
| 4,864,244 | 9/1989 | Sasaki | 329/304 |
| 4,901,332 | 2/1990 | Williams et al. | 375/81 |
| 5,095,536 | 3/1992 | Loper | 455/324 |
| 5,317,599 | 5/1994 | Obata | 375/86 |
| 5,448,774 | 9/1995 | Yokozaki et al. | 455/343 |
| 5,457,811 | 10/1995 | Lemsun | 455/67.1 |
| 5,566,201 | 10/1996 | Östman | 375/200 |
| 5,596,605 | 1/1997 | Kiyanagi et al. | 375/326 |

*Primary Examiner*—Stephen Chin
*Assistant Examiner*—Muhammad Ghayour

[57] ABSTRACT

In accordance with one embodiment of the present invention, in a wireless telecommunications system, an automatic gain control loop for a base station, comprises a demodulator having at least one output terminal. The demodulator is adapted to demodulate signals received by the base station so as to provide a plurality of phase signals via its output terminals. These phase signals correspond to the phase of the signals received by the base station. A plurality of variable-gain amplifiers are adapted to receive one of the phase signals and to change the amplitude of said phase signals. A plurality of signal processing units are adapted so as to receive signals provided by the variable amplifiers, and each of the signal processing units is further adapted to generate a feedback control signal so as to control the gain of each one of the variable-gain amplifiers. In accordance with another embodiment of the invention, a method for controlling the gain of signals received by a base station in a cellular communication system comprises the steps of demodulating the signals so as to generate phase signals corresponding to the received signals, variably controlling the magnitude of each one of the phase signals based on a feedback control signal, and processing the phase signals so as to generate the feedback control signal.

19 Claims, 4 Drawing Sheets

AUTOMATIC GAIN CONTROL LOOP

FIELD OF THE INVENTION

This invention relates to an automatic gain control loop employed in telecommunication circuits, and more specifically, to an automatic gain control loop circuit used in a base station of a wireless telecommunications system.

BACKGROUND OF THE INVENTION

Most wireless telecommunications systems are based on the cellular principle. Basically, a geographical area, within which wireless service is available, is divided into several cells 10 as illustrated in FIG. 1. Schematically, each cell is represented as a hexagon; in practice, however, each cell has a shape that is dependent on, among other things, the topography of the terrain serviced by the system. Each cell includes a base station 12, which may be located approximately at its center. Each base station 12 is configured to transmit and receive signals within approximately the area defined by each cell 10. Dashed lines 18 in FIG. 1 illustrate the actual radio range of each base station. As illustrated, this actual radio range may extend beyond each cell area. Therefore, it is desired that a different set of frequencies be allocated to the adjacent cells to avoid interference. Subscribers located within each cell area communicate with other subscribers by using a wireless terminal 16 (e.g., a cellular telephone, a wireless local loop terminal, some cordless telephones, one-way and two-way pagers, PCS terminals and personal digital assistants). Each wireless terminal located within a cell sends to and receives signals from the corresponding base station located in that cell, over a communications channel within a predetermined frequency range.

Since adjacent cells employ different sets of frequencies, the distance between two cells that use the same frequency set may be an important design consideration. This distance is called the mean reuse distance D. In order to increase the total number of channels available per unit area, it is desired to decrease the size of the cells. By reducing the size of the cells, it is possible to reuse the same frequency sets more often. Thus, more subscribers may be able to use the system, because of the increase of available frequency sets within a predetermined area. However, depending upon the size of each cell, the reuse distance D may become small enough to cause co-channel interference between the cells that use the same frequency range.

One way to reduce the level of interference between cells that use the same frequency range is to employ directional antennas at each base station. Each cell is divided into several sectors, with each sector being served by a directional antenna located at the base station. By employing these directional antennas it is possible to allocate frequency sets to each sector such that the possibility of co-channel interference among cells employing these frequency sets is minimized.

Each directional antenna may be used for both transmitting signals from the base station to the wireless terminal, or for receiving signals from the wireless terminals at the base station. As mentioned, each cell may be divided into a few sectors, for example three sectors, requiring a base station with three separate directional antennas. In more highly populated areas where the cells are substantially small, even higher number of sectors per cell may be desired so as to reduce co-channel interference. This sectorization technique is well-known and described in *Cellular Radio Principles and Design*, by Raymond C. V. Macario (McGraw Hill, 1993), which is incorporated herein by reference.

One disadvantage of sectorization is the requirement of a more complex base station design. For example, when a wireless terminal is moving from one sector to another sector within the same cell, a technique may be employed to change the frequency with which the base and wireless terminals communicate. This change of communication frequency for an in process call is known as "hand-over" or "hand-off." Although hand-off is required when traveling from one cell to the other, with sectorization, it may be also required when traveling from one sector to the other within the same cell.

The sector-to-sector hand-off is particularly desired in frequency-division multiple access ("FDMA") and time-division multiple access ("TDMA") communication schemes. The operation of both of these communication schemes is well-known and described in *Information Transmission, Modulation, And Noise*, by Mischa Schwartz (3rd ed. McGraw Hill 1980), incorporated herein by reference.

Recently, wireless telecommunications systems have also employed code-division multiple access ("CDMA"), which is also well-known and described in TR 45 standard specification, entitled *Mobile Station- Base Station Compatibility Standard for Dual-Mode Wideband Spread Spectrum Cellular System* (to be published as IS-95-A) and incorporated herein by reference. Basically, with a code-division multiple access scheme, all wireless terminals within a cell transmit and receive signals over the same frequency channel and at the same time. Each wireless terminal uses a unique code to encode the user's information; at the base station, the received signal is decoded based on all the available unique codes.

One advantage of code-division multiple access is that a hand-off within one cell may not be necessary. Since all wireless terminals transmit signals over the same channel, it is not necessary to switch communication frequencies when traveling from one sector to another. However, the base station employing CDMA, still requires complex circuitry as will be explained in more detail hereinafter in reference with FIG. 3.

Thus, there exists a need for a more simplified base station design that operates in conjunction with a sectorized cell structure.

SUMMARY OF THE INVENTION

In accordance with one embodiment of the present invention, in a wireless telecommunications system, an automatic gain control loop for a base station, comprises a demodulator having at least one output terminal, the demodulator being adapted to demodulate signals received by the base station so as to provide a plurality of phase signals via its output terminals, the phase signals corresponding to the phase of the signals received by said base station; a plurality of variable-gain amplifiers are each adapted to receive one of the phase signals to change the amplitude of the phase signals; and a plurality of signal processing units each adapted so as to receive signals provided by the variable amplifiers, each of the signal processing units further adapted to generate a feedback control signal so as to control the gain of each one of the variable-gain amplifiers.

In accordance with another embodiment of the invention, a method for controlling the gain of signals received by a base station in a cellular communication system comprises the steps of: demodulating the signals so as to generate phase signals corresponding to the received signals; variably controlling the magnitude of each one of the phase signals based on a feedback control signal; and processing the phase signals so as to generate the feedback control signal.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE DRAWINGS

Figure 1:
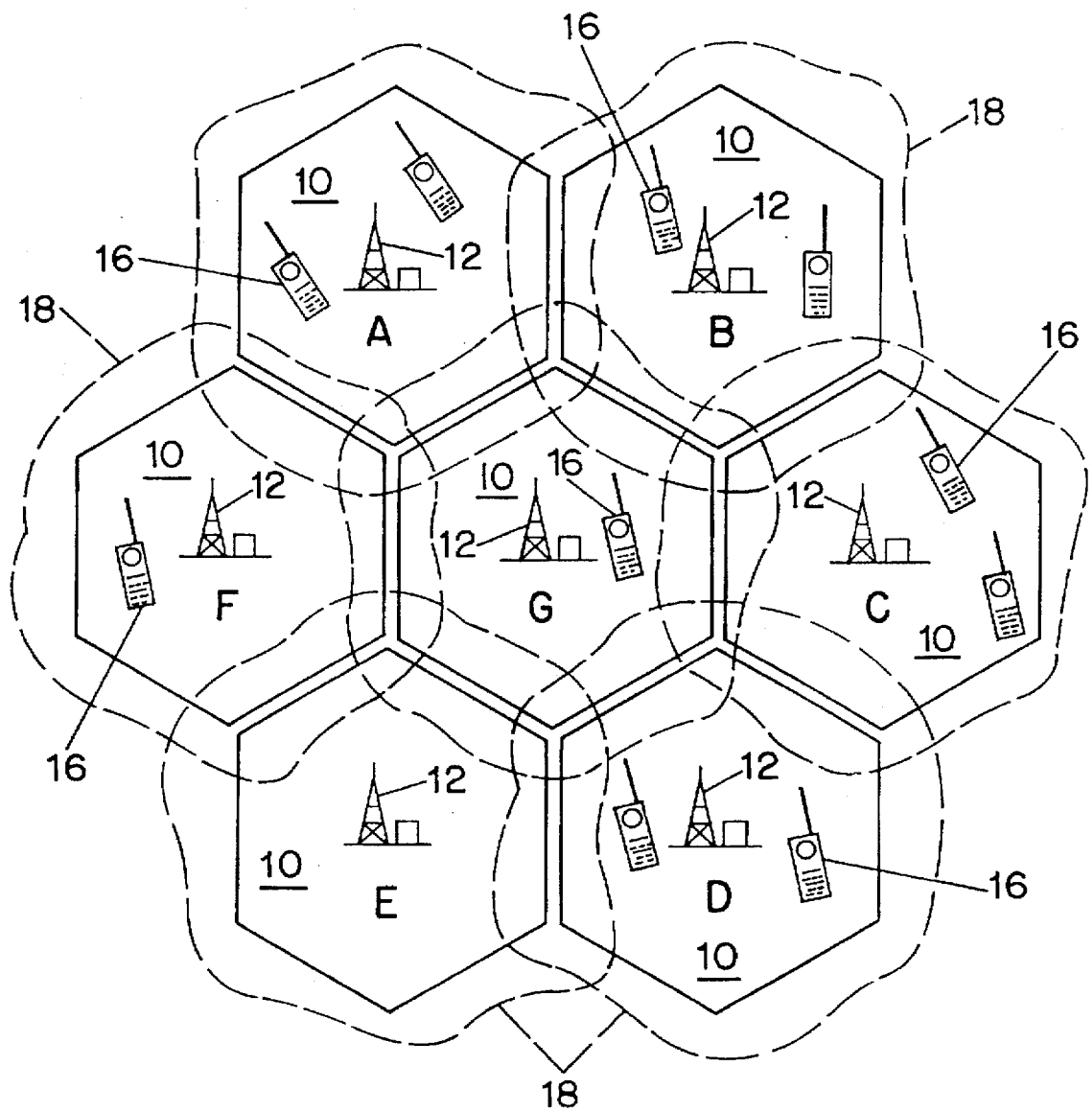
FIG. 1 illustrates a cell structure employed in wireless telecommunications systems such as the one used in connection with the present invention.
Figure 2:
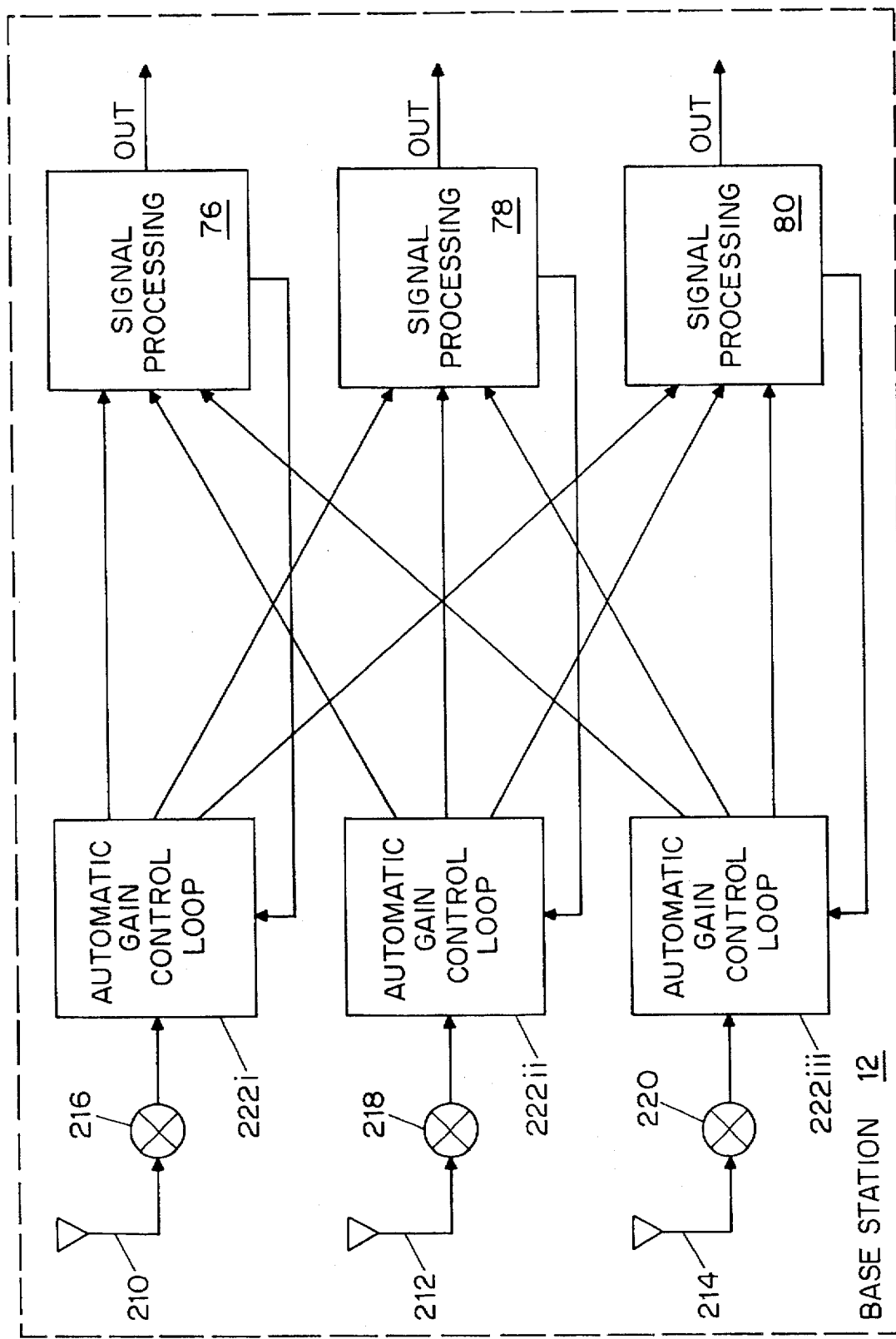
FIG. 2 illustrates a block diagram of a base station for receiving signals from a sectorized cell in accordance with one embodiment of the present invention.

FIG. 2 illustrates a block diagram of a base station 12 employed for receiving signals from wireless terminals located within a sectorized cell. It is assumed that this cell has been divided into three 120° sectors. Base station 12 may comprise three directional antennas, such as 210, 212 and 214 for receiving signals from a wireless terminal that may be located within one of the three sectors in a cell. Preferably, the output of each antenna is coupled to an input terminal of a mixer, such as 216, 218 and 220, employed to convert the frequency range of the received signal from radio frequency RF to a lower intermediate frequency IF. The output terminal of each mixer is coupled to an automatic gain control loop, such as 222-i, 222-ii and 222-iii. Each gain control loop routes the incoming signal into three separate branches. Each branch is coupled to a signal processing unit, such as 76, 78 and 80, as will be explained in more detail. Thus each one of the signal processing units receives three signals corresponding to antennas 210, 212 and 214 respectively, as illustrated in FIG. 2.

Each signal processing unit may preferably generate three feedback signals, each of which is coupled to one of the automatic gain control loops 222. FIG. 2 illustrates: a feedback link from signal processing unit 76 to automatic gain control loop 222-i; a feedback link from signal processing 78 to automatic gain control loop 222-ii; and a feedback link from signal processing unit 80 to automatic gain control loop 222-iii. Base station 12 also includes: feedback links from signal processing unit 76 to automatic gain control loops 222-ii and 222-iii (not shown); feedback links from signal processing unit 78 to automatic gain control loops 222-i and 222-iii (not shown); and feedback links from signal processing unit 80 to automatic gain control loops 222-i and 222-ii (not shown).

The magnitude of the voltage signals provided by each one of the automatic gain control loops is controlled by a feedback signal generated by each signal processing unit. For example, the magnitude of the voltage signal provided by automatic gain control loop 222-i to signal processing unit 76, may be controlled by a feedback signal generated by signal processing unit 76. Likewise, the magnitude of the voltage signal provided by automatic gain control loop 222-i, to signal processing unit 78, may be controlled by a feedback signal generated by signal processing unit 78. Likewise, the magnitude of the voltage signal provided by automatic gain control loop 222-i, to signal processing unit 80, may be controlled by a feedback signal generated by signal processing unit 80.

During operation, each automatic gain control loop may receive the same signal generated by a wireless terminal. Each automatic gain control loop provides the same signal to each one of the signal processing units. Each signal processing unit analyzes the signals received from each of the antennas. In response, it may control, for example, the signal generated by one of the automatic gain control loops. The output signal of each signal processing unit may be preferably coupled to a wireless switching center, which, in turn, may route this signal to a local switching office.

Figure 3:
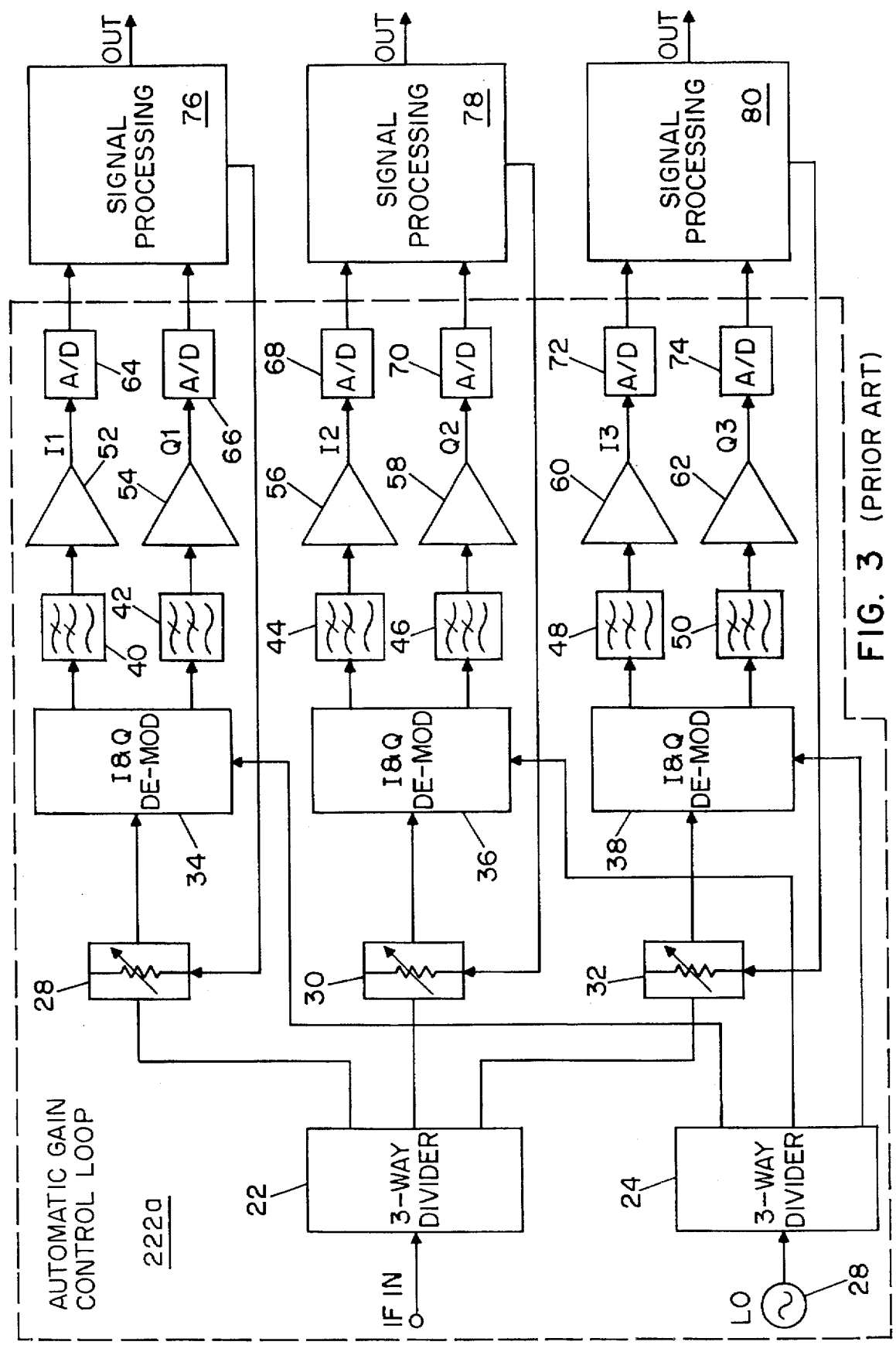
FIG. 3 illustrates a block diagram of a prior art automatic gain control loop.

As mentioned before, the design of prior art automatic gain control loops is substantially complicated, involving a substantial number of components. For example, FIG. 3 illustrates a block diagram of a prior art base station automatic gain control loop 222-a, typically employed for receiving signals from a sectorized cell. Again, it is assumed that this cell has been divided into three 120° sectors. Each antenna (not shown) may cover ⅓ of an entire cell. A wireless terminal transmits a signal to the base station. The base station may receive this signal through each one of the antennas. The output terminal of each antenna provides a signal that is coupled to an automatic gain control loop such as 222-a. The signals received by each antenna are fed to the input terminal of a 3-way divider 22 of a corresponding automatic gain control loop. The output terminals of the 3-way divider are coupled to the input terminal of three separate attenuators such as 28, 30, and 32. These attenuators may employ available designs such as diodes configured to function as a resistor. In the alternative, amplifiers with gains ranging from a negative value to a positive value may be employed. Therefore, in this discussion, attenuators and variable-gain amplifiers may be discussed interchangeably.

The output terminal of each attenuator 28, 30 and 32 is respectively coupled to corresponding input terminals of demodulators 34, 36 and 38. Each demodulator provides a plurality of phase signals that correspond to the phase of the signals received by the modulator. For a communication system utilizing quadrature phase shift keying (QPSK), demodulators 34, 36 and 38 may be a conventional QPSK demodulator like the one described in *Information Transmission, Modulation, And Noise*, by Mischa Schwartz (3rd ed. McGraw Hill 1980). Each demodulator 34, 36 and 38 includes two output terminals for providing in-phase (I) and quadri-phase (Q) component data signals. Each of these output terminals is in turn coupled to a low pass filter. Output terminals of demodulator 34 are respectively coupled to low pass filters 40 and 42. Similarly, output terminals of demodulator 36 are respectively coupled to low pass filters 44 and 46. Likewise, output terminals of demodulator 38 are respectively coupled to low pass filters 48 and 50. Each of these low pass filters substantially eliminates high frequency components of the received signals.

The output terminal of each low pass filter is coupled to the input terminal of a signal amplifier such as operational amplifiers, 52, 54, 56, 58, 60 and 62. The output terminal of each of these amplifiers is coupled to the input terminal of an analog-to-digital (A/D) converter, such as converters 64, 66, 68, 70, 72 and 74. The output terminal of each analog-to-digital converter is, in turn, coupled to the input terminal of a signal processing unit, such as signal processing units 76, 78, and 80. Each signal processing unit provides data processing for each call in progress and certain administrative tasks. An example of functions provided by a signal processing unit is described in TR 45 standard specification, entitled *Mobile Station-Base Station Compatibility Standard for Dual-Mode Wideband Spread Spectrum Cellular System* (to be published as IS-95-A). Signal processing unit, among other things, determines the magnitude of signals received. It also generates a feedback control signal to adjust the gain of signals received by the base station antennas in an automatic gain control loop. Other functions of the signal processing unit include checking the identity of a wireless terminal whose signal is being processed, and checking whether the wireless terminal is within a satisfactory communications range.

One output terminal of each signal processing unit is coupled to an input terminal of the corresponding attenuator contained in each automatic gain control loop. For example, an output terminal of signal processing unit 76 is coupled to an input terminal of attenuator 28. An output terminal of signal processing unit 78 is coupled to an input terminal of attenuator 30. Likewise an output terminal of signal processing unit 80 is coupled to an input terminal of attenuator 32. Each signal processing unit is configured so as to provide a feedback signal to the corresponding attenuators 28, 30 and 32, in an automatic gain control loop, so as to control the attenuation of signals received by this automatic gain control loop.

Finally, a local oscillator 26 generates a sinusoidal signal at its output terminal. The output signal from local oscillator 26 is coupled to each one of demodulators 34, 36 and 38 via a three-way divider 24. For each automatic gain control loop, three way divider 24 utilizes the oscillating signal provided by local oscillator 26 to demodulate the signals received by the automatic gain control loop.

For a cellular system employing code-division multiple access (CDMA), some of the wireless terminals within a cell, regardless of the sector within which they are located, transmit signals at the same frequency. Therefore, when a wireless terminal travels from one sector to the other, there may be no desire to switch communication channels. During operation, a wireless terminal sends a signal, which, depending on its location within the cell, is received by one or more of the antennas (not shown) located on base station 12. The output signal of each antenna is coupled to a corresponding automatic gain control loop, and in turn, its three way divider 22, which provides the same received signal through its three output terminals.

As illustrated above with reference to FIG. 3, the major components of an automatic gain control loop coupled to each antenna, include three quadrature phase shift keying (QPSK) demodulators, three voltage variable attenuators, and two three-way dividers. These components require large board space and lead to substantially high manufacturing cost. The number of these components may be substantially reduced in accordance with one embodiment of the invention as explained hereinafter.

Figure 4:
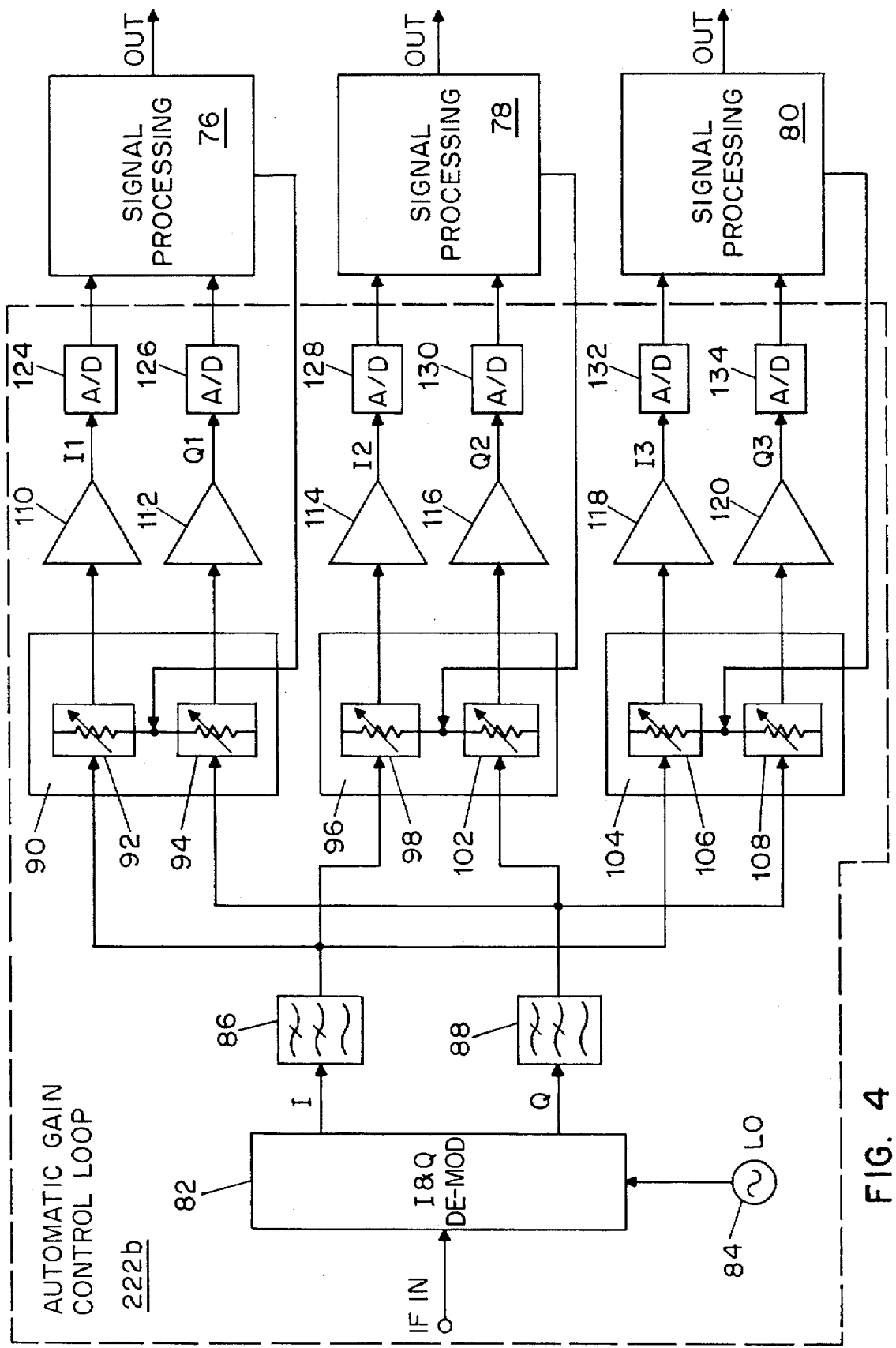
FIG. 4 illustrates a block diagram of an automatic gain control loop for receiving signals from a sectorized cell in accordance with the present invention.

FIG. 4 illustrates one embodiment of a base station automatic gain control loop, generally designated as 222-*b*, in accordance with the present invention, for receiving signals from a sectorized cell. Again, it is assumed that this cell has three 120° sectors. However, the invention is not limited in scope to a three-sector cell, and it will be clear to those skilled in the art how to make and use embodiments of the present invention that have a plurality of sectors. Typically, an automatic gain control loop in accordance with the present invention may be conveniently employed in a wireless telecommunications system wherein each cell may have several sectors.

For this particular embodiment, each antenna (not shown) may serve ⅓ of an entire cell. A wireless terminal transmits a signal to a base station, such as one described in reference with FIG. 2. The base station may receive this signal through each one of the antennas. The output terminal of each antenna is coupled to an automatic gain control loop such as 222-*b*. The signal received by each antenna is fed to a corresponding input terminal of a quadrature phase shift keying demodulator 82. A local oscillator 84 provides an appropriate frequency signal to demodulator 82. Although this embodiment may employ QPSK demodulation, the present invention is not limited in scope in this respect and other modulation schemes may be employed.

Demodulator 82 provides in-phase (I) and quadri-phase (Q) signal components through its two output terminals. The in-phase signal is preferably coupled to a low pass filter 86, and the quadri- phase signal is preferably coupled to a low pass filter 88. The output of low pass filter 86 may be coupled to one input terminal of three dual-mode voltage variable attenuators, such as 90, 96 and 104. The output terminal of low pass filter 88 may be coupled to the second input terminal of dual-mode voltage variable attenuators 90, 96 and 104. In this context, variable-gain amplifiers that are capable of both amplification and attenuation may also be used instead of the attenuators. It will be appreciated that instead of coupling the output terminals of filter 86 and 88 directly to dual-mode attenuators, it may be desirable to employ a three way splitter to distribute the output signals to each one of the dual-mode attenuators. However, for applications where the frequency of signals at the output port of filters 86 and 88 is sufficiently low, such three way splitters may not be desired.

Each dual-mode voltage variable attenuator 90, 96 and 104 advantageously comprises two voltage variable attenuators. For example dual-mode voltage variable attenuator 90 may include two voltage variable attenuators, such as 92 and 94. Likewise, dual-mode voltage variable attenuator 96 may include two voltage variable attenuators, such as 98 and 102. Similarly, dual-mode voltage variable attenuator 104 may include two voltage variable attenuators, such as 106 and 108.

Voltage variable attenuator pairs 92 and 94, 98 and 102, 106 and 108, are preferably balanced so as to provide substantially equal amplification and phase delay in response to their respective input signals. In one embodiment in accordance with the present invention, instead of variable attenuators, a dual-mode variable-gain amplifier may be employed and configured to operate substantially the same as the dual, low noise, wideband variable-gain amplifier, model AD600/602 manufactured by Analog Devices, Norwood, Mass. Such a dual-mode variable-gain amplifier contains two amplification channels, with each channel providing a variable-gain from −10 dB to +30 dB. In another embodiment of the invention, a dual-mode variable attenuator may be configured to operate substantially the same as the balanced dual-mode variable attenuator, manufactured by Alpha Industries, Woodburn, Mass. The amplitude of the in-phase and quadri-phase signal components of the received signal is variably controlled by a control voltage signal coupled to each dual-mode variable attenuator or amplifier.

The output terminals of dual-mode variable attenuator 90 are preferably coupled to operational amplifiers 110 and 112, respectively. Likewise, the output terminals of dual-mode variable attenuator 96 are preferably coupled to operational amplifiers 114 and 116, respectively. Similarly, the output terminals of dual-mode variable attenuator 104 are preferably coupled to amplifiers 118 and 120, respectively. The output terminals of each of these amplifiers are coupled to an analog-to-digital (A/D) converter, such as 124, 126 and 128, 130 and 132, 134. The output terminals of analog-to-digital converters 124 and 126 are coupled to signal processing unit 76. The output terminals of analog-to-digital converters 128 and 130 are coupled to signal processing unit 78. Finally, the output terminals of analog-to-digital converters 132 and 134 are coupled to signal processing unit 80.

As mentioned before, each signal processing unit provides data processing for each call in progress and certain administrative tasks, such as those set forth in TR 45 standard specification, entitled *Mobile Station-Base Station Compatibility Standard for Dual-Mode Wideband Spread Spectrum Cellular System* (to be published as IS-95-A). Some functions of signal processing units include checking the identity of a wireless terminal whose signal is being processed, and whether the wireless terminal is within a satisfactory communications range.

One output terminal of signal processing unit is coupled to an input terminal of the corresponding attenuator. For example, an output terminal of signal processing unit 76 is coupled so as to provide a feedback control voltage signal to dual-mode variable attenuator 90. An output terminal of signal processing unit 78 is coupled so as to provide a feedback control voltage signal to dual-mode variable attenuator 96. Likewise an output terminal of signal processing unit 80 is coupled so as to provide a feedback control voltage signal to dual-mode variable attenuator 104.

As mentioned before, for a cellular system employing code-division multiple access (CDMA), all wireless terminals within a cell, regardless of the sector within which they are located, transmit signals at the same frequency range. Therefore, when a wireless terminal travels from one sector to the other, there is no desire to switch communication channels between the mobile and base stations. In such a cellular system, however, when traveling from one sector to the other, the codes employed in the code-division multiple access (CDMA) may be switched according to the sectors where communication between a mobile and base station takes place. Switching codes from one sector of a cell to another may be accomplished more conveniently than switching frequencies, as is the case with time division multiple access scheme.

During operation, a wireless terminal sends a signal, which, depending on its location within the cell, may be received by one or more of the antennas of the corresponding base station (not shown) located within a cell. Illustratively, the output signal of one of the antennas may be coupled to demodulator 82, via a mixer described in reference with FIG. 2, so as to demodulate the received signals. For quadrature phase shift keying (QPSK) modulation, demodulator 82 provides in-phase and quadri-phase signals via two output terminals. For other types of modulation schemes, in accordance with other embodiments of the invention, such as M-ary modulation, the received signal may be demodulated into several phase signals.

Low pass filters 86 and 88 may substantially eliminate high frequency component signals received from demodulator 82. Each in-phase and quadri-phase signal, is preferably balanced by the dual-mode variable-gain attenuators such that the amplitude and phase delay of the in-phase and quadri-phase signals remain substantially equal. The output signals from the variable-gain attenuators are then preferably converted to a digital format by analog-to-digital converters and thereafter fed to the signal processing units. A feedback signal from each signal processing unit controls the attenuation of signals received by the dual-mode variable attenuators.

It will be appreciated that the automatic gain control loop design for a wireless telecommunications base station in accordance with the present invention significantly reduces the required board space and manufacturing cost by eliminating demodulators and three-way power dividers.

While only certain features of the invention have been illustrated and described herein, many modifications, substitutions, changes or equivalents will now occur to those skilled in the art. It is therefore, to be understood that the appended claims are intended to cover all such modifications and changes as fall within the true spirit of the invention.

We claim:

1. In a wireless telecommunications system, an automatic gain control loop for a base station having a plurality of antennas for receiving a signal within a cell site, said automatic gain control loop comprising:

a demodulator coupled to one of said antennas, so as to receive and demodulate said signal, said demodulator having at least one output terminal, to route a demodulated phase signal into a plurality of separate branches via said at least one output terminal, said demodulated phase signal corresponding to the phase of said received signal;

a plurality of variable-gain amplifiers each adapted to receive said phase signals to variably change the amplitude of said phase signals; and a plurality of signal processing units each adapted so as to receive signals provided by said variable amplifiers via one of said separate branches, each of said signal processing units further adapted to provide a feedback control signal to a corresponding one of said variable amplifiers so as to control the gain of each one of said variable amplifiers.

2. An automatic gain control loop in accordance with claim 1, wherein said demodulator performs quadrature phase shift keying demodulation, and said demodulator further comprises a first and a second terminal for providing respectively an in-phase signal component and a quadri-phase signal component corresponding to said signals received by said base station.

3. An automatic gain control loop in accordance with claim 2 further comprising:

a local oscillator adapted to provide a demodulation frequency signal to said demodulator; and a plurality of low pass filters having an input terminal coupled to the output terminal of said demodulator, said low pass filters having an output terminal coupled to said variable amplifiers so as to provide low pass filtered phase signals to said variable amplifiers.

4. An automatic gain control loop in accordance with claim 3 wherein said variable-gain amplifier comprises a first and a second variable-gain amplifier so as to amplify said in-phase and said quadri-phase signals with an amplification factor ranging from negative values to positive values.

5. An automatic gain control loop in accordance with claim 4 wherein said first and second variable-gain amplifiers receive said feedback control signal from said signal processing units so as to vary said amplification factor.

6. An automatic gain control loop in accordance with claim 5 wherein said first and second variable-gain amplifiers are balanced so as to provide substantially equal amplitude and phase delay to signals received by said first and second amplifiers.

7. An automatic gain control loop in accordance with claim 6, further comprising a plurality of analog-to-digital converters each having an input terminal adapted to receive signals provided by said first and second variable-gain amplifiers, said analog-to-digital converters each having an output terminal adapted to provide digital signals to said signal processing units.

8. In a wireless telecommunications system, an automatic gain control loop for a base station having a plurality of antennas for receiving a signal within a cell site, said automatic gain control loop comprising:

a demodulator coupled to one of said antennas, so as to receive and demodulate said signal, said demodulator having at least one output terminal, to route a demodulated phase signal into a plurality of separate branches via said at least one output terminal;

a plurality of low pass filters coupled to the output terminals of said demodulator;

a plurality of variable attenuators each adapted to receive said low pass filtered signals provided by said low pass filters; and a plurality of signal processing units each adapted so as to receive signals provided by said variable attenuators, via one of said separate branches each of said signal processing units further adapted to provide a feedback control signal to a corresponding one of said variable attenuators so as to control the attenuation of each one of said variable attenuators.

9. An automatic gain control loop in accordance with claim 8, wherein said demodulator performs quadrature phase shift keying demodulation, and said demodulator further comprises a first and a second terminal for providing respectively an in-phase signal component and a quadri-phase signal component corresponding to said signals received by said base station.

10. An automatic gain control loop in accordance with claim 9 further comprising a local oscillator adapted to provide a demodulation frequency signal to said demodulator.

11. An automatic gain control loop in accordance with claim 10 wherein said variable attenuators each comprise a first and a second variable-gain attenuator so as to attenuate said in-phase and said quadri-phase signals with an attenuation factor in response to said feedback control signal.

12. An automatic gain control loop in accordance with claim 11 wherein said first and second variable-gain attenuators receive said feedback control signal from said signal processing units so as to vary said attenuation factor.

13. An automatic gain control loop in accordance with claim 12 wherein said first and second variable-gain attenuators are balanced so as to provide substantially equal amplitude and phase delay to signals received by said first and second attenuators.

14. An automatic gain control loop in accordance with claim 13, further comprising a plurality of analog-to-digital converters each having an input terminal adapted to receive signals provided by said first and second variable-gain attenuators, said analog-to-digital converters each having an output terminal adapted to provide digital signals to said signal processing units.

15. An automatic gain control loop in accordance with claim 14 wherein said wireless telecommunications system comprises a plurality of cell sites, each cell being divided into a plurality of sectors, and said base station comprises a plurality of directional antennas adapted to receive signals from a plurality of wireless terminals located within said sectors of each corresponding cell.

16. An automatic gain control loop in accordance with claim 15, wherein said wireless terminals communicate with said base stations in accordance with a code-division multiple access communication scheme.

17. A method for controlling the gain of a signal received by a base station having a plurality of antennas for receiving said signal within a cell site in a cellular communication system comprising the steps of:

demodulating said signal received by one of said antennas so as to provide demodulated phase signals via separate branches to a plurality of variable amplifiers;

variably controlling the magnitude of each one of said phase signals based on a feedback control signal provided to each one of said variable amplifiers; and processing said phase signals by a plurality of signal processors such that each signal processor generates said feedback control signal.

18. The method in accordance with claim 17, further comprising, after said step of demodulating, the step of low pass filtering said phase signals corresponding to said received signals.

19. The method in accordance with claim 18, further comprising, after said step of variably controlling, the step of converting said phase signals from an analog version to a digital version.

* * * * *